United States Patent
Schwarz

(10) Patent No.: US 6,505,308 B1
(45) Date of Patent: Jan. 7, 2003

(54) FAST BUILT-IN SELF-REPAIR CIRCUIT

(75) Inventor: William Schwarz, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/428,799

(22) Filed: Oct. 28, 1999

(51) Int. Cl.[7] .............................................. G06F 11/00
(52) U.S. Cl. ........................................ 714/30; 711/104
(58) Field of Search ............................ 714/30, 32, 39, 714/41, 42, 25, 27, 54, 718, 733; 711/104, 105, 133, 163

(56) References Cited

U.S. PATENT DOCUMENTS

| | | | | |
|---|---|---|---|---|
| 5,353,253 A | * | 10/1994 | Nakajima | 365/200 |
| 5,699,306 A | * | 12/1997 | Lee et al. | 365/200 |
| 5,748,543 A | * | 5/1998 | Lee et al. | 365/200 |
| 5,764,652 A | * | 6/1998 | Chun | 371/10.3 |
| 5,774,471 A | * | 6/1998 | Jiang | 371/10.3 |
| 5,822,228 A | * | 10/1998 | Irrinki et al. | 364/580 |
| 5,909,404 A | * | 6/1999 | Schwarz | 365/201 |
| 5,920,515 A | * | 7/1999 | Shaik et al. | 365/200 |
| 5,938,774 A | * | 8/1999 | Hsu | 714/6 |
| 6,011,734 A | * | 1/2000 | Pappert | 365/200 |
| 6,065,141 A | * | 5/2000 | Kitagawa | 714/711 |
| 6,085,334 A | * | 7/2000 | Giles et al. | 714/7 |
| 6,111,801 A | * | 8/2000 | Brady | 365/201 |

* cited by examiner

Primary Examiner—Nadeem Iqbal
(74) Attorney, Agent, or Firm—Conley, Rose & Tayon

(57) ABSTRACT

A fast method and apparatus for built-in self-repair (BISR) of memory arrays is disclosed. In one embodiment, an integrated circuit includes a repair circuit coupled between the address decoder and the memory array. The address decoder receives memory addresses and asserts corresponding word lines. The memory array has default words associated with the word lines, but also includes extra words. By default, the repair circuit maps the word lines from the address decoder to the memory array word lines for the default words. However, the repair circuit includes at least one latch for each of the decoder word lines. When a latch is set, the repair circuit isolates the decoder word line from the default word and remaps the decoder word line to an extra word in the memory. The latches remain set while as long as power is applied, so that accesses to faulty memory words are automatically rerouted without any additional overhead relative to accesses to functional memory words. This may advantageously provide significantly reduced memory access times for only a small increase in hardware cost.

11 Claims, 2 Drawing Sheets

FAST BUILT-IN SELF-REPAIR CIRCUIT

BACKGROUND OF THE INVENTION

1. Field of the Invention

This invention relates to the field of digital electronic memory devices, and in particular to a fast method and apparatus for repairing memories by replacing defective rows or columns with redundant rows or columns.

2. Description of the Related Art

Since users generally depend upon the reliability of memory chips for their own systems to function properly, it is common practice for the manufacturers of memory chips to test the functionality of chips at the manufacturing site before the chips are sold to users. The manufacturers' reputations depend upon the reliability of their chips. As the line width of memory cells within a memory array circuit chip continues to shrink, this reliability becomes more difficult to achieve. An ongoing challenge for the manufacturers of memory devices is to increase memory capacity without sacrificing reliability or suffering decreasing chip yields due to malfunctioning parts.

Before the memory chips are released for shipment, they typically undergo testing to verify that the support circuitry for the memory array and the individual circuitry for each of the memory cells within the memory array is functioning properly. One standard way for testing chip memories involves using an external memory tester or Automatic Test Equipment (ATE) at the manufacturing site. An external memory tester supplies power and applies test patterns to the chip to detect faults. External memory testers can only test a limited number of chips at a time, and the test speed is limited by the external bus speed. Consequently, this method of testing is expensive in terms of time requirements and equipment costs.

Partly to address these issues, and partly to provide off-site testing, built-in self-test (BIST) units are now commonly incorporated into memory chips. Automated test equipment can now be simplified to the extent that the only necessary functions are to supply power (and sometimes a clock signal) to the memory chip, and to monitor a single output signal from the chip. The on-board BIST unit generates all the test patterns and asserts (or de-asserts) the output signal if the chip passes the functionality test. The BIST can be configured to run every time the chip is powered-on, or the BIST may be configured to run only when a test mode signal is asserted.

The BIST unit operates by writing and reading various patterns to/from the memory to determine various kinds of memory faults. In general, a BIST unit writes a data value to a memory cell and subsequently reads the memory cell. By comparing the data written and the data subsequently returned from the memory cell, the BIST unit is able to determine whether the memory cell is faulty. If too many errors are detected, then the fault may exist in the support circuitry.

It is not uncommon for a significant percentage of the memory cells within the chip to fail because of defects in the substrate or errors in the manufacturing process. To compensate for this, many memory chips are provided with a set of extra memory cells that can be used in place of the defective ones. Configuring the memory chip to replace the defective cells is termed "Repairing" the memory array. Some memory repair is performed at the manufacturing site. Conventional repairing techniques bypass the defective cells using fuseable links that cause address redirection. However, these techniques require significant capital investment for implementing the repairing process, and moreover fail to address the possibility of failure after shipment from the manufacturing facility.

To reduce repair costs and allow field repairs, some memory chips have been equipped with built-in self test (BIST) and built-in self repair (BISR) circuitry. The BIST circuit detects faults in the memory array and notifies the BISR circuit of the fault locations. The BISR circuitry generally reassigns the row or column containing the failing cell to a spare row or column in the memory array. BIST and BISR are typically performed each time power is applied to the system. This allows any latent failures that occur between subsequent system power-ups to be detected in the field.

BISR circuits traditionally employ content-addressable memories (CAM) that store the addresses of the failing rows or columns. During operation, incoming addresses are supplied to the CAM, and the CAM asserts a "hit" signal if the incoming address corresponds to one of the stored failing addresses. A rerouting operation is then performed to conduct the desired memory operation on a replacement row or column in the memory array. In fast memories, this multi-step process requires a substantial fraction of the memory access time. A faster BISR method and apparatus would advantageously reduce memory access time, thereby allowing memories to operate at higher clock frequencies.

SUMMARY OF THE INVENTION

Accordingly, there is disclosed herein a fast method and apparatus for built-in self-repair (BISR) of memory arrays. In one embodiment, an integrated circuit includes a repair circuit coupled between the address decoder and the memory array. The address decoder receives memory addresses and asserts corresponding word lines. The memory array has default words associated with the word lines, but also includes extra words. By default, the repair circuit maps the word lines from the address decoder to the memory array word lines for the default words. However, the repair circuit includes at least one latch for each of the decoder word lines. When a latch is set, the repair circuit isolates the decoder word line from the default word and remaps the decoder word line to an extra word in the memory. The latches remain set while as long as power is applied, so that accesses to faulty memory words are automatically rerouted without any additional overhead relative to accesses to functional memory words. This may advantageously provide significantly reduced memory access times for only a small increase in hardware cost.

BRIEF DESCRIPTION OF THE DRAWINGS

Other objects and advantages of the invention will become apparent upon reading the following detailed description and upon reference to the accompanying drawings in which.

Figure 1:
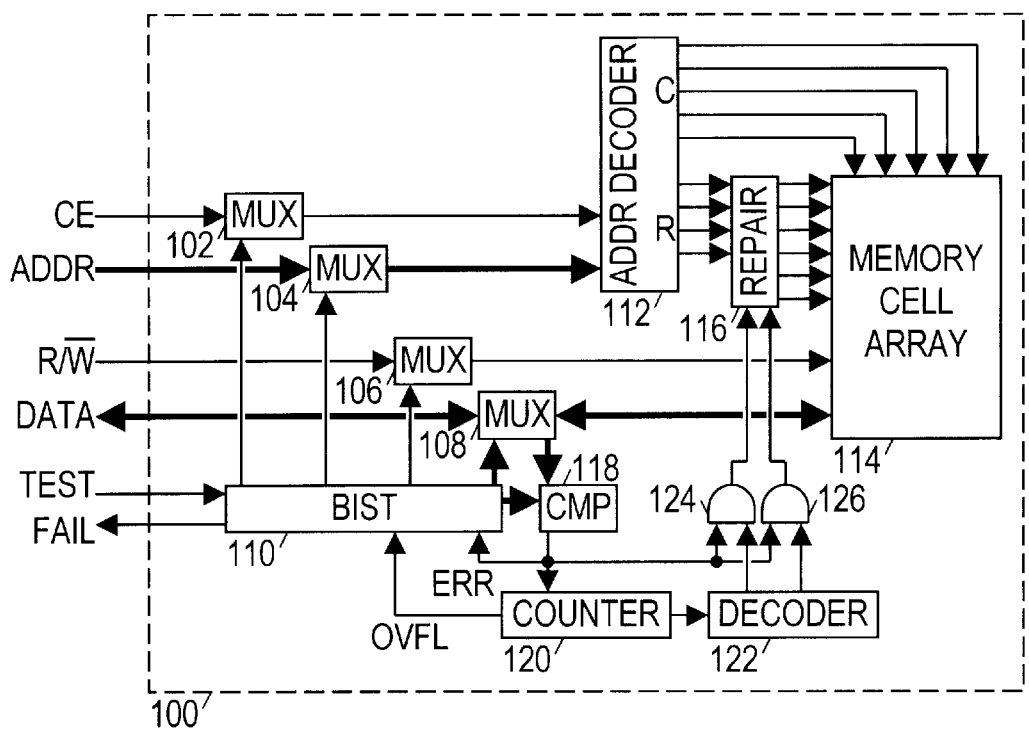
FIG. 1 depicts a functional block diagram of a memory equipped with BIST and BISR according to one embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

In the following description, the terms "assert" and "de-assert" are used when discussing logic signals. When a logic signal is said to be asserted, this indicates that an active-high signal is driven high, whereas an active-low signal is driven low. Conversely, de-assertion indicates that an active-high signal is driven low, and that an active-low signal is driven high. As used herein, the term "BIST" refers to the actual test, while "BIST unit" and "BIST circuitry" refer to the circuitry that performs BIST. Similarly, "BISR" refers to the process of built-in self repair, while "BISR unit" and "BISR circuitry" refer to the circuitry that performs BISR.

DETAILED DESCRIPTION OF THE INVENTION

Turning now to the figures, FIG. 1 shows a memory 100 having a set of signal lines that include a chip enable line (CE), an address bus (ADDR), a read/write line (R/$\overline{W}$), a bi-directional data bus (DATA), a test line (TEST), and a fail line (FAIL). A set of multiplexers 102, 104, 106, and 108 allows a BIST unit 110 to take control of the CE, ADDR, R/$\overline{W}$, and DATA lines, respectively, when the TEST line is asserted. The CE and ADDR lines from multiplexers 102, 104 connect to address decoder 112. When the CE line is asserted, address decoder 112 asserts a row line and a column line to access a cell or set of cells in memory cell array 114 that correspond to the value on the address lines. Some embodiments may employ only row lines and allow all columns of a given row to be accessed when the corresponding row line is asserted. If the R/$\overline{W}$ line is asserted, the data from the accessed cells is driven onto the DATA lines. Otherwise, the binary values on the DATA lines are stored into the accessed cells.

A repair circuit 116 is provided between the address decoder 112 and the memory array 114 to remap asserted row lines from defective rows to redundant rows provided for this purpose. In another embodiment, the repair circuit may be used to remap column lines. In yet another embodiment, two repair circuits may be used: one for the row lines and one for the column lines. The repair circuit 116 is discussed further below.

When the TEST line is asserted, the BIST unit 110 takes control of the CE, ADDR, R/$\overline{W}$, and DATA lines, and conducts a pattern of read and write operations designed to detect faults in the memory cell array. During write operations, the BIST unit 110 supplies test data to the memory cell array on the DATA lines. During read operations, the BIST unit 110 supplies expected output data to the comparator 118, and the comparator 118 compares values on the DATA lines to the expected output. When a mismatch is detected, comparator 118 asserts an error signal line (ERR). A counter 120 increments an error count every time the ERR line is asserted, and a decoder 122 asserts an error number line that corresponds to the error count. Counter 120 also produces an overflow signal (OVFL) that is asserted when the number of detected errors exceeds the number of extra lines available. Upon detecting assertion of the OVFL signal, BIST unit 110 ceases testing and holds the FAIL line in an asserted state. If the testing completes without assertion of the OVFL signal, BIST unit 110 de-asserts the FAIL line.

The error number lines from decoder 122 are each gated through a logical AND gate. (The output of logical AND gates 124 and 126 are labeled ERR0 and ERR1, respectively, in FIG. 2.) Initially, the error count is zero, and decoder 122 asserts the first error number line. This signal is blocked by logical AND gate 124 until an error is detected and comparator 118 momentarily asserts the error signal. This momentary assertion allows the logical AND gate 124 to pulse the ERR0 signal. Counter 120 increments and decoder 122 then asserts the second error number line to logical AND gate 126. A subsequent defect detection would similarly cause logical AND gate 126 to pulse the ERR1 signal.

In memory 100, the repair circuit 116 is configured to remap faulty rows as they are detected. Consequently, faulty rows are replaced by potentially un-initialized rows in the middle of testing. The BIST unit 110 prevents the potentially incorrect values stored in a replacement row from manifesting as an error in any subsequent accesses to the address where the error was detected. In one embodiment, the BIST unit 110 is configured to write a suitable value to the address after the replacement occurs and before proceeding with the testing. In another embodiment, the BIST unit 110 tracks the faulty addresses and disables the comparator 118 during subsequent reads from the faulty addresses. In yet another embodiment, the BIST unit 110 re-starts the test after a row is replaced. In any case, the FAIL signal should not be de-asserted until the BIST unit 110 has performed a complete test without detecting any faults. Accordingly, if one or more faults is detected and repaired during a test, the BIST unit should repeat the test to verify the functionality of the repairs.

Memory 100 may alternatively be configured to allow BIST unit 110 to locate all the defects in memory cell array 114 before attempting any repairs. This configuration allows for determination of an optimal remapping solution when both columns and rows are being replaced, but requires a significantly more complex BIST unit implementation.

Figure 2:
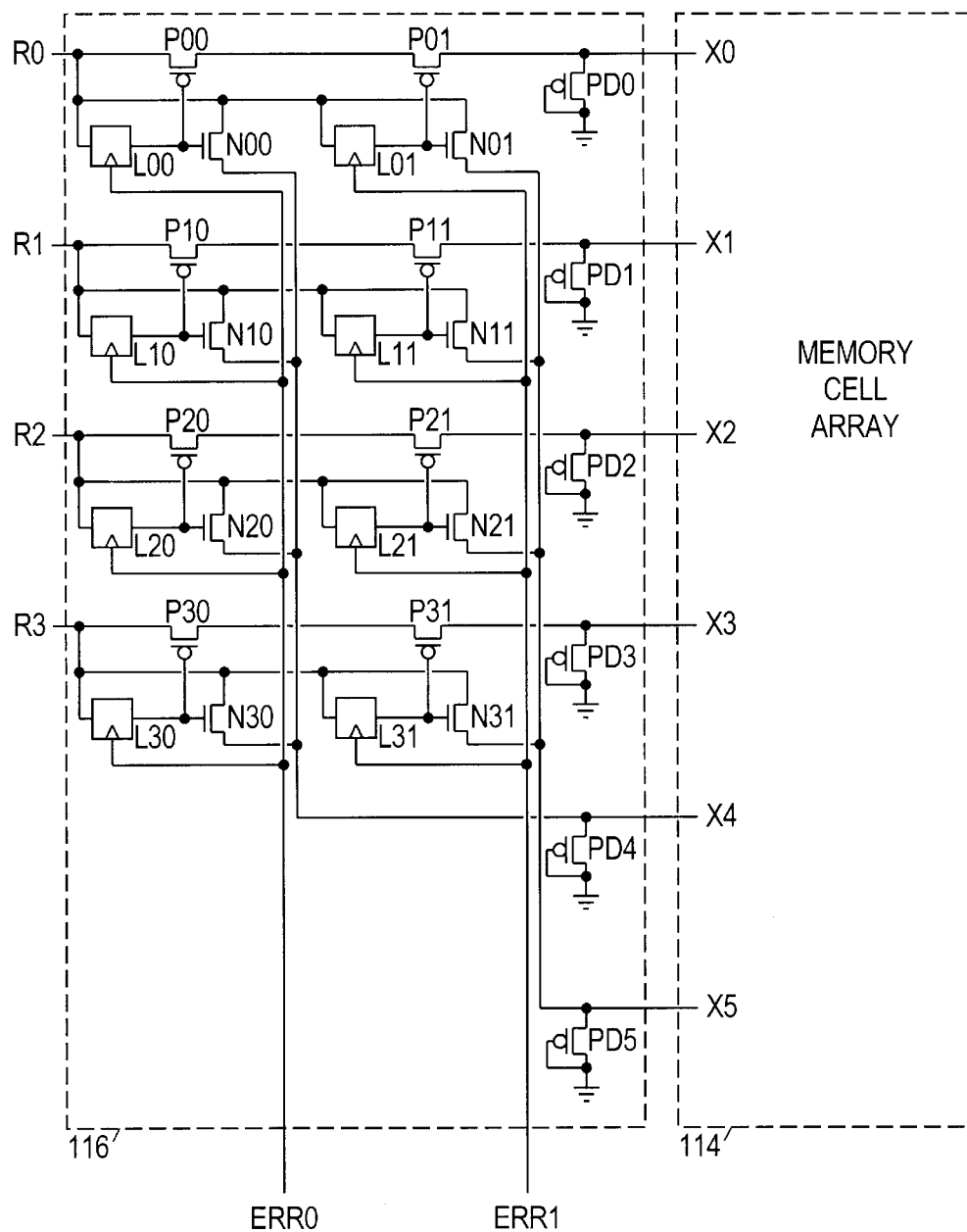
FIG. 2 depicts a functional block diagram of one remapping circuit embodiment suitable for the memory of FIG. 1.

Referring now to FIG. 2, repair circuit 116 receives row signal lines R0–R4 from address decoder 112 and error number signal lines ERR0–ERR1 from logical AND gates 124, 126, and provides physical row signal lines X0–X5 to memory cell array 114. Physical row signal lines X4 and X5 are row access lines for "extra" rows in memory cell array 114. Each of the physical row signal lines are equipped with pull-down resistances in the form of purposefully degraded transistors PD0–PD5. Of course, resistors or other pull-down resistance means may alternatively be employed. The pull-down resistances keep the X0–X5 lines de-asserted when not being used.

By default, the row signal lines R0–R4 are mapped to physical row signal lines X0–X4. A set of isolation transistors, one for each extra physical row signal line that can be used to replace a given row signal line, is placed in series between the row signal line and the default physical row signal line. For example, isolation transistors P00 and P01 are in series between R0 and X0, isolation transistors P10 and P11 are in series between R1 and X1, isolation transistors P20 and P21 are in series between R2 and X2, and isolation transistors P30 and P31 are in series between R3 and X3. Each of these isolation transistors is controlled by a corresponding latch that, when set, isolates the row signal line from the default physical row signal line. In other words, latch L00 or latch L01 control isolation transistors P00 and P01, respectively, and either one may be used to isolate R0 from X0. By default all latch outputs are de-asserted.

The latches each also control a corresponding remap transistor that is complementary to the isolation transistors.

For example, remap transistors N00, N01, N10, N11, N20, N21, N30, and N31 are controlled by latches L00, L01, L10, L11, L20, L21, L30, and L31 respectively. When a latch is set, the corresponding remap transistor connects the associated row signal line to the associated physical row signal line. In other words, remap transistors N00, N10, N20, and N30 connect to physical row line X4. If latch L00 is set, row line R0 is coupled to physical row line X4.

Each of the latches is configured to latch the value of the associated row line when a clock signal is asserted. The clock signals for the latches are the error number signals. For example, latch L31 stores the value of row line R3 when the ERR1 signal is asserted.

Repair circuit 116 operates in the following manner. Initially, all the latches are initialized to zero, so that all row lines are mapped to their default physical lines. If a fault is detected during a memory access, e.g., reading from a cell in row 1, the first error number line ERR0 is pulsed. Since ERR0 is coupled as a clock signal to latches L00, L10, L20, and L30, each of these latches stores the value of the corresponding row line. Since only one of the row lines R0-R4 is asserted, only the latch corresponding to the asserted row line is set, causing the row line to be isolated from the default physical row line and remapped to the first extra physical row line. If in a subsequent access, e.g., to row 3, a fault is detected, the second error number line ERR1 is pulsed, and that row is remapped to the second extra physical row line.

It is noted that alternate configurations of the repair circuitry are contemplated as being within the scope of the attached claims. These include switching the complementary transistors shown in FIG. 2 and using active-low signals, and attaching the latch inputs to the input terminal of the corresponding isolation transistors.

It may be preferred to have the repair circuitry configured so that any defective row can be replaced with any extra row, or it may be preferred to have the memory cell array divided into "banks" with corresponding sets of extra rows that can only be used to replace defective rows within the banks. This latter configuration may advantageously reduce hardware requirements for the repair circuitry at the cost of being unable to repair some defects that would otherwise be repairable in the former configuration. Memory columns may be similarly handled.

It is contemplated to have the BIST run every time power is supplied to the chip, so that the latches can be set and the memory thereby configured to remap faulty rows or columns to redundant rows or columns. It is noted that no further action is necessary to ensure that memory accesses are routed properly, unlike in conventional systems where memory accesses are compared to a stored list of known defective addresses to determine if remapping is needed. The performance penalty incurred in conventional systems is thereby avoided, allowing these memories to operate at significantly higher clock frequencies.

Numerous variations and modifications will become apparent to those skilled in the art once the above disclosure is fully appreciated. It is intended that the following claims be interpreted to embrace all such variations and modifications.

What is claimed is:

1. A device which comprises:
  an address decoder configured to receive an address and to assert a corresponding one of a set of decoder signal lines;
  a memory cell array having a set of access lines that includes a set of default access lines and a set of extra access lines, wherein each default access line is associated with a respective decoder signal line in the set of decoder signal lines; and
  a repair circuit which includes:
    a set of remap transistors, wherein each decoder signal line from the set of decoder signal lines is coupled to each extra access line from the set of extra access lines by a remap transistor from the set of remap transistors; and
    a set of latches, each configured to control a respective remap transistor from the set of remap transistors, wherein each latch is coupled to the corresponding decoder signal line and coupled to a remap signal line associated with the corresponding extra access line, wherein each latch is configured to be set when the remap signal and the decoder signal line are concurrently asserted.

2. The device of claim 1, further comprising:
  a set of pull-down resistances, wherein each extra access line is coupled to a de-assertion voltage by a respective pull-down resistance.

3. The device of claim 1, further comprising:
  a set of isolation transistors, each coupled between a corresponding decoder signal line and the associated default access line,
  wherein each latch from the set of latches is configured to control an isolation transistor associated with the decoder line to which the latch is coupled.

4. The device of claim 3, further comprising:
  a built-in self-test unit coupled to the remap signal lines and configured to assert a remap signal line when a decoder signal line corresponding to a defective memory cell is asserted, whereby a latch is set and the associated isolation transistor and associated remap transistors are configured to isolate the associated decoder signal line from the associated default access line and to unite the associated decoder signal line to the associated extra access line.

5. A method of repairing memory arrays, wherein the method comprises:
  identifying a defective portion of the memory array; and
  setting a flip-flop that corresponds to a defective portion of the memory array and an extra portion of the memory array, wherein said setting comprises:
    asserting a decoder signal line that corresponds to a defective portion of the memory array;
    asserting a remap signal line that corresponds to an extra portion of the memory array;
    gating the remap signal to provide a clock pulse to the flip-flop, whereupon the flip-flop latches the value of the decoder signal line;
    incrementing an error counter to obtain an error count; and
    decoding the error count to assert a subsequent remap signal line.

6. The method of claim 5, further comprising:
  asserting a failure signal if the error count exceeds a number of extra portions of the memory array.

7. An integrated circuit which comprises:
  an address decoder configured to receive a memory address and configured to assert an associated one of a set of decoder signal lines;
  a memory array having access lines that activate associated portions of the memory array to allow memory operations in those portions, wherein the memory array includes default portions and extra portions, wherein each of the default portions are associated with a respective decoder signal line; and a repair circuit which couples the decoder signal lines to the access lines, wherein the repair circuit includes at least one latch for each decoder signal line, wherein the latches are de-asserted by default, and wherein when a latch is asserted, the repair circuit isolates the decoder signal line from an access line to the associated default portion of the memory array and joins the decoder signal line to an access line for an extra portion of the memory array.

8. The integrated circuit of claim 7, wherein each latch is coupled to the associated decoder signal line, and is further coupled to a remap signal line associated with an extra portion of the memory array, wherein the latch is asserted only if the decoder signal line and the remap signal line are concurrently asserted.

9. The integrated circuit of claim 7, further comprising:

a built-in self-test (BIST) unit which applies memory operations to the memory array to identify defective portions of the memory array; and a comparator coupled to the BIST unit to receive an expected output signal and coupled to the memory array to receive an actual output signal, wherein the comparator asserts a mismatch signal if the actual output signal does not match the expected output signal.

10. The integrated circuit of claim 9, further comprising:

an error counter coupled to the comparator and configured to increment when the mismatch signal is asserted;

an error decoder coupled to the error counter to receive an error count and configured to assert a error number line that corresponds to the error count; and a set of gates each coupled to an error number line and coupled to the comparator to receive the mismatch signal, wherein the gates are each configured to assert a corresponding remap signal line only if both the error number line and the mismatch signal are asserted.

11. The integrated circuit of claim 10, wherein each latch is coupled to the associated decoder signal line, and is further coupled to a remap signal line associated with an extra portion of the memory array, wherein the latch is asserted only if the decoder signal line and the remap signal line are concurrently asserted.

* * * * *